United States Patent
Lee et al.

(10) Patent No.: US 11,818,850 B2
(45) Date of Patent: Nov. 14, 2023

(54) FLUX DOTTING TOOL

(71) Applicant: SAMSUNG ELECTRONICS CO., LTD., Suwon-si (KR)

(72) Inventors: Seungjin Lee, Hwaseong-si (KR); Jongbeom Park, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 4 days.

(21) Appl. No.: 17/582,590

(22) Filed: Jan. 24, 2022

(65) Prior Publication Data

US 2023/0007787 A1 Jan. 5, 2023

(30) Foreign Application Priority Data

Jun. 30, 2021 (KR) .................. 10-2021-0085584

(51) Int. Cl.
*B23K 1/00* (2006.01)
*H05K 3/40* (2006.01)
*B23K 1/20* (2006.01)

(52) U.S. Cl.
CPC .......... *H05K 3/4007* (2013.01); *B23K 1/203* (2013.01); *H05K 2203/0126* (2013.01)

(58) Field of Classification Search
CPC ......... H05K 3/4007; H05K 2203/0126; H05K 3/3489; B23K 1/203; B23K 3/082; B23K 3/0638; H01L 24/742; H01L 24/75; H01L 24/81; H01L 2224/742; H01L 2224/75
USPC ............... 228/223, 207, 36, 33, 248.1–248.5
See application file for complete search history.

(56) References Cited

U.S. PATENT DOCUMENTS

| | | | | | |
|---|---|---|---|---|---|
| 4,518,114 | A | * | 5/1985 | Walsh | B23K 3/0669 228/180.1 |
| 5,676,305 | A | * | 10/1997 | Potter | H05K 3/3489 228/223 |
| 5,686,226 | A | * | 11/1997 | Groman | H05K 13/0469 430/327 |
| 5,816,481 | A | * | 10/1998 | Economy | H05K 3/3489 228/223 |
| 5,834,062 | A | * | 11/1998 | Johnson | B05C 11/1034 427/256 |

(Continued)

FOREIGN PATENT DOCUMENTS

| | | | | | |
|---|---|---|---|---|---|
| CN | 108697427 | A | * | 10/2018 | ............. A61B 17/12 |
| JP | 05200585 | A | * | 8/1993 | |

(Continued)

*Primary Examiner* — Kiley S Stoner
(74) *Attorney, Agent, or Firm* — Sughrue Mion, PLLC

(57) ABSTRACT

A flux dotting tool is provided that includes: a housing having an internal space and a plurality of through-holes extending from the internal space to an outside of the housing; a plurality of flux pins disposed in the internal space to correspond to the plurality of through-holes, respectively, wherein each of the plurality of flux pins includes a flux holding portion extending in a first direction and that is exposed to the outside of the housing, and a flux blocking structure protruding in a second direction, perpendicular to the first direction, from a side surface of the flux holding portion, and the flux blocking structure is configured to limit a flux wetting region; and an elastic structure disposed on the plurality of flux pins in the internal space and configured to impart elastic force in the first direction.

19 Claims, 11 Drawing Sheets

(56) References Cited

U.S. PATENT DOCUMENTS

| | | | |
|---|---|---|---|
| 5,899,376 A * | 5/1999 | Tatumi | B23K 1/203 228/36 |
| 6,300,678 B1 | 10/2001 | Suehiro et al. | |
| 8,146,793 B2 | 4/2012 | Ng et al. | |
| 11,235,404 B2 * | 2/2022 | Arvin | B23K 3/08 |
| 2010/0209674 A2 * | 8/2010 | Ng | B23K 1/203 118/200 |
| 2012/0006364 A1 * | 1/2012 | Kim | H01L 21/67051 134/99.1 |
| 2014/0242753 A1 * | 8/2014 | Yeo | H01L 24/75 228/33 |
| 2019/0295976 A1 * | 9/2019 | Niwa | H01L 24/05 |

FOREIGN PATENT DOCUMENTS

| | | | | |
|---|---|---|---|---|
| JP | 5-309474 A | | 11/1993 | |
| JP | 09082719 A | * | 3/1997 | ............ B23K 1/203 |
| JP | 10051120 A | * | 2/1998 | |
| JP | H1051120 A | * | 2/1998 | |
| JP | 2000101223 A | * | 4/2000 | ............ B23K 1/203 |
| JP | 2001035873 A | * | 2/2001 | ............ B23K 1/203 |
| JP | 2010-114309 A | | 5/2010 | |
| JP | 2010114309 A | * | 5/2010 | |
| JP | 2010-267672 A | | 11/2010 | |
| JP | 2010267672 A | * | 11/2010 | |
| JP | 2014-167975 A | | 9/2014 | |
| KR | 19990059042 A | * | 7/1999 | |
| KR | 200292789 Y1 | * | 12/2002 | |
| KR | 100379091 B1 | * | 4/2003 | |
| KR | 10-2005-0012506 A | | 2/2005 | |
| KR | 10-0779454 B1 | | 11/2007 | |
| KR | 100779454 B1 | * | 11/2007 | |
| KR | 10-0846827 B1 | | 7/2008 | |
| KR | 100846827 B1 | * | 7/2008 | |
| KR | 20180119269 A | * | 11/2018 | |
| KR | 20190055374 A | * | 5/2019 | |
| KR | 10-2100205 B1 | | 4/2020 | |
| WO | WO-2006112791 A1 | * | 10/2006 | ............ B23K 1/203 |

\* cited by examiner

FLUX DOTTING TOOL

CROSS-REFERENCE TO THE RELATED APPLICATION

This application claims the benefit under 35 USC 119(a) of Korean Patent Application No. 10-2021-0085584, filed on Jun. 30, 2021, in the Korean Intellectual Property Office, the entire disclosure of which is incorporated herein by reference for all purposes.

BACKGROUND

Embodiments of the present disclosure relate to a flux dotting tool.

As electronic devices and related semiconductor devices are miniaturized, a flip-chip bonding method by which a semiconductor device is mounted on a substrate (e.g., a main board) using a solder ball is used. The solder ball may be formed by dotting flux on a pad to which the solder ball is to be fused, and then bumping the solder ball on the flux. In order to stably form a solder ball, a technology capable of uniformly dotting an appropriate amount of flux on a plurality of pads is required.

SUMMARY

Non-limiting example embodiments of the present disclosure provide a flux dotting tool having a constant flux dotting amount.

According to embodiments, a flux dotting tool is provided. The flux dotting tool includes: a housing having an internal space and a plurality of through-holes extending from the internal space to an outside of the housing; a plurality of flux pins disposed in the internal space to correspond to the plurality of through-holes, respectively, wherein each of the plurality of flux pins includes a flux holding portion extending in a first direction and that is exposed to the outside of the housing, and a flux blocking structure protruding in a second direction, perpendicular to the first direction, from a side surface of the flux holding portion, and the flux blocking structure is configured to limit a flux wetting region; and an elastic structure disposed on the plurality of flux pins in the internal space and configured to impart elastic force in the first direction, wherein the flux holding portion includes a wetting portion below the flux blocking structure and a non-wetting portion above the flux blocking structure, a height of the wetting portion in the first direction has a ratio within a range of 1 to 3 with respect to a minimum diameter of a tip surface of the wetting portion in the second direction, and a diameter of the flux blocking structure in the second direction has a ratio within a range of 1 to 2 to the minimum diameter of the wetting portion.

According to one or more embodiments, each of the plurality of flux pins further includes a head portion having a first diameter greater than a diameter of the plurality of through-holes, and a body portion extending from the head portion with a second diameter less than the first diameter and inserted into a respective one of the plurality of through-holes, and the flux holding portion extends from the body portion.

According to one or more embodiments, the minimum diameter of the wetting portion is less than the second diameter.

According to one or more embodiments, the height of the wetting portion has a ratio in a range of 1.5 to 2.5 with respect to the minimum diameter of the wetting portion.

According to one or more embodiments, the diameter of the flux blocking structure has a ratio within a range of 1.2 to 1.8 to the minimum diameter of the wetting portion.

According to one or more embodiments, the flux holding portion has a cylindrical shape extending in the first direction.

According to one or more embodiments, the wetting portion has a shape in which a side surface of the wetting portion is tapered in such a manner that a width of the wetting portion in the second direction increases as the wetting portion approaches the flux blocking structure.

According to one or more embodiments, each of the plurality of flux pins further includes a protrusion structure extending from an end of the wetting portion in the first direction and having a diameter less than the minimum diameter of the wetting portion.

According to one or more embodiments, a lower surface and a side surface of the wetting portion and at least a portion of a lower surface of the flux blocking structure have a surface roughness.

According to one or more embodiments, the flux blocking structure has a lower surface convexly rounded toward the wetting portion.

According to one or more embodiments, the flux blocking structure has a lower surface concavely rounded toward the non-wetting portion.

According to a flux dotting tool is provided. The flux dotting tool includes: a plurality of flux pins extending in a first direction, the plurality of flux pins each including a wetting portion that is configured to be in contact with flux during a dotting process of the flux, and a non-wetting portion that is configured to not be in contact with the flux during the dotting process; and a flux blocking structure configured to protrude from a lower portion of each of the plurality of flux pins in a second direction, perpendicular to the first direction, to define the wetting portion and the non-wetting portion, wherein in the dotting process of the flux, a lower surface of the flux blocking structure is configured to be in contact with the flux, and an upper surface of the flux blocking structure is configured to not be in contact with the flux.

According to one or more embodiments, in the dotting process of the flux, a side surface of the flux blocking structure is configured to not be in contact with the flux.

According to one or more embodiments, a height of the wetting portion in the first direction has a ratio in a range of 1 to 3 with respect to a minimum diameter of a tip surface of the wetting portion.

According to one or more embodiments, a diameter of the flux blocking structure in the second direction has a ratio within a range of 1 to 2 with respect to a minimum diameter of a tip surface of the wetting portion.

According to embodiments, a flux dotting tool is provided. The flux dotting tool includes: a plurality of flux pins including a flux holding portion, including a wetting portion configured to be in contact with flux and a non-wetting portion configured to not be in contact with the flux during a dotting process of the flux, each of the plurality of flux pins further including a flux blocking structure configured to protrude along a side surface of the flux holding portion to define the wetting portion and the non-wetting portion, wherein a height of the wetting portion has a ratio within a range of 1.5 to 2.5 with respect to a minimum diameter of a tip surface of the wetting portion, and a diameter of the flux blocking structure has a ratio within a range of 1.2 to 1.8 with respect to the minimum diameter of the wetting portion.

According to one or more embodiments, the minimum diameter of the wetting portion is a diameter of an end of the wetting portion that is configured to be in contact with the flux.

According to one or more embodiments, the minimum diameter of the wetting portion has a ratio within a range of 0.5 to 1 with respect to a diameter of an opening through which the flux is to be dotted.

According to one or more embodiments, the flux blocking structure has a lower surface facing the wetting portion, an upper surface facing the non-wetting portion, and a side surface between the lower surface and the upper surface, and in the dotting process of the flux, the lower surface of the flux blocking structure is configured to be in contact with the flux.

According to one or more embodiments, in the dotting process of the flux, the upper surface and the side surface of the flux blocking structure are configured to not be in contact with the flux.

BRIEF DESCRIPTION OF DRAWINGS

The above and other aspects, features, and advantages of embodiments of the present disclosure will be more clearly understood from the following detailed description, taken in conjunction with the accompanying drawings, in which.

DETAILED DESCRIPTION

Hereinafter, non-limiting example embodiments of the present disclosure will be described with reference to the accompanying drawings.

Figure 1A:
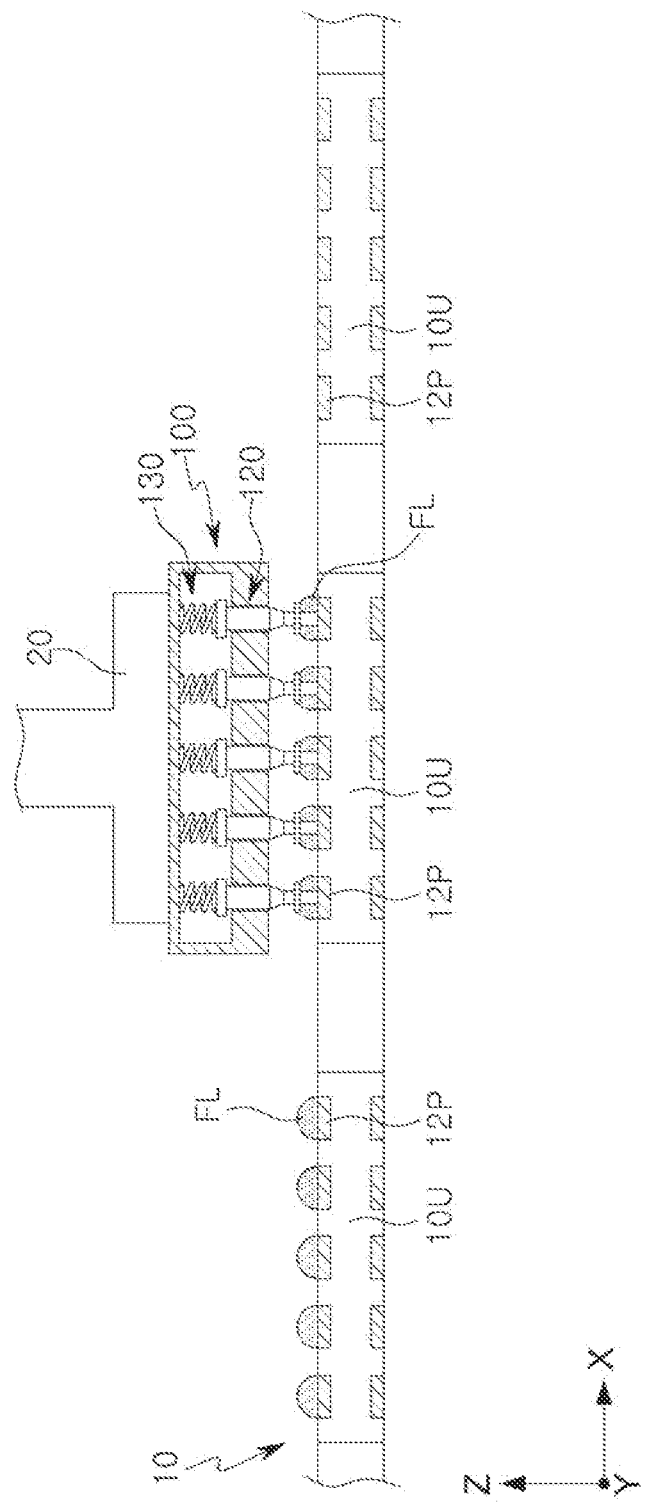
FIG. 1A is a cross-sectional view illustrating a flux dotting tool and a substrate strip according to an example embodiment.
Figure 1B:
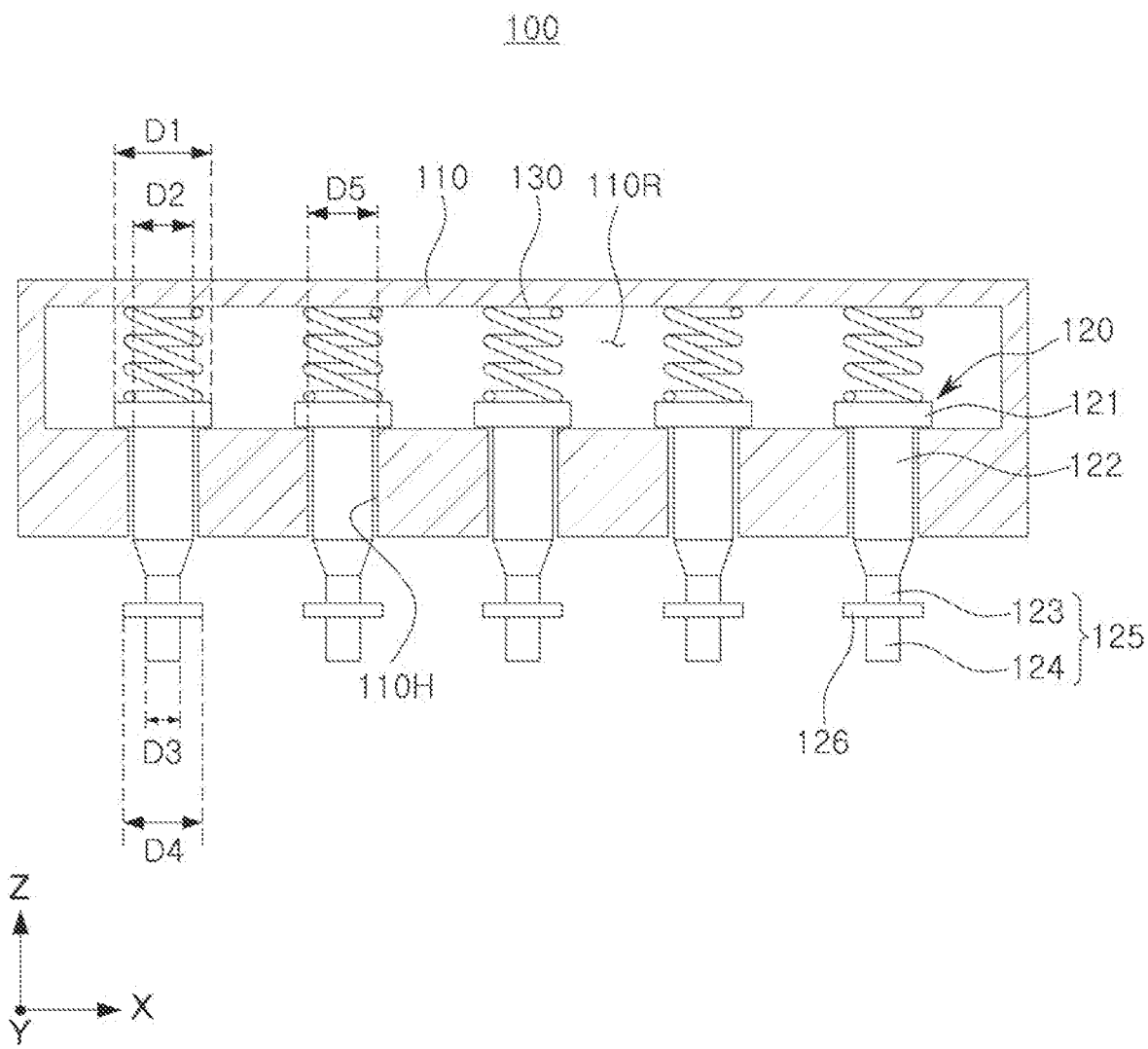
FIG. 1B is a cross-sectional view illustrating the flux dotting tool according to an example embodiment.

FIGS. 1A and 1B are cross-sectional views illustrating a flux dotting tool 100 according to an example embodiment. FIG. 1A is a state diagram of a flux dotting tool 100 according to an example embodiment, and FIG. 1B is an enlarged cross-sectional view of the flux dotting tool 100 of FIG. 1A.

Referring to FIG. 1A, the flux dotting tool 100 serves to dot flux FL on pads 12P of a plurality of substrate units 10U in the flux dotting equipment (e.g., solder ball mount equipment). The flux dotting process may be performed on a substrate strip 10 to which the plurality of substrate units 10U are integrally connected. A plurality of pads 12P are formed on the plurality of substrate units 10U, and the flux dotting tool 100 may include a plurality of flux pins 120 corresponding to the plurality of pads 12P. The flux dotting tool 100 may be attached to a separate transport member, for example, a mount block 20 to move on the substrate strip 10 to perform a flux dotting process. The mount block 20 may immerse the plurality of flux pins 120 in a flux plate (not illustrated) filled with liquid flux to aggregate the flux FL at the ends of each of the plurality of flux pins 120. Subsequently, the mount block 20 moved to the substrate unit 10U may seat the flux FL held by the plurality of flux pins 120 on each of the plurality of pads 12P. In this process, the plurality of flux pins 120 may contact the plurality of pads 12P, and the plurality of flux pins 120 may elastically move in a vertical direction by an elastic structure 130. After the flux dotting process is completed, a solder ball attach (SBA) process for attaching solder balls to the flux FL and pads 12P of the substrate unit 10U may be continuously performed.

Referring to FIG. 1B, the flux dotting tool 100 according to an example embodiment may include a housing 110 and a plurality of flux pins 120. In addition, the flux dotting tool 100 may further include the elastic structure 130 disposed on the plurality of flux pins 120. In an example embodiment, a flux wetting region of the plurality of flux pins 120 may be limited by introducing a flux blocking structure 126 to lower portions of the plurality of flux pins 120. For example, the flux dipped on the ends of the plurality of flux pins 120 may be prevented from climbing to the top of the plurality of flux pins 120 beyond the flux blocking structure 126. Therefore, according to an example embodiment, there may be provided a flux dotting tool in which the amount of applied flux is maintained at a constant level even when the flux dotting process is continued for a long time. In this case, "flux" refers to any material for preventing the solder balls from dissolving and/or flowing onto the substrate and from being oxidized in the reflow process, and the "flux" in this specification is not particularly limited. Also, the "wetting region" may be understood as a space or area occupied by the flux on the ends of the flux pins 120, which is aggregated into a spherical or hemispherical shape by surface tension.

The housing 110 may include an internal space 110R accommodating the plurality of flux pins 120 and a plurality of through-holes 110H into which the plurality of flux pins 120 are inserted. The plurality of through-holes 110H may extend from the internal space 110R to an external of the housing 110 to guide the movement of the plurality of flux pins 120. The plurality of through-holes 110H may be provided with a pitch and number corresponding to the pads 12P of the substrate on which the solder balls are to be bumped. Accordingly, the plurality of through-holes 110H and the plurality of flux pins 120 corresponding thereto may be provided in the same number as the number of pads on which the solder ball is to be formed. For example, the plurality of through-holes 110H may include a larger number of through-holes than is illustrated in the drawings. The housing 110 is not particularly limited in shape and material. For example, the shape of the housing 110 is not limited to that illustrated in the drawings, and the housing 110 may have a form in which a plurality of parts are assembled.

The plurality of flux pins 120 are disposed in the internal space 110R of the housing 110, and extend in the first direction (Z-axis direction) to be exposed externally of the housing 110 through the plurality of through-holes 110H. The plurality of flux pins 120 may include the flux holding portion 125 on which flux is deposited in the flux dipping and dotting process, and the flux blocking structure 126 limiting the flux wetting region of the flux holding portion 125. The shape and material of the plurality of flux pins 120 are not particularly limited, and the plurality of flux pins 120 may be formed of a material and a shape capable of satisfying characteristics (e.g., flexural rigidity, flux wettability, or the like) required in the process of dipping in the flux (flux dipping and dotting process). For example, the plurality of flux pins 120 according to an example embodiment may include a head portion 121, a body portion 122, a flux holding portion 125, and the flux blocking structure 126.

The head portion 121 may be formed to have a diameter that does not pass through the plurality of through-holes 110H. For example, the head portion 121 may have a first diameter D1 greater than a diameter D5 of the plurality of through-holes 110H. The head portion 121 is located inside the housing 110 and may receive elastic force directly or indirectly from the elastic structure 130. The diameter or size of the head portion 121 may be determined in consideration of the number and spacing of the plurality of flux pins 120, and is not particularly limited.

The body portion 122 is a portion inserted into the plurality of through-holes 110H, and at least a portion of the body portion 122 may enter and exit the housing 110 through the plurality of through-holes 110H. The body portion 122 may extend integrally from the lower portion of the head portion 121, but the configuration is not limited thereto. Accordingly, the body portion 122 may be formed to have a diameter passing through the plurality of through-holes 110H. For example, the body portion 122 may have a second diameter D2 less than the first diameter D1 of the head portion 121. The second diameter D2 may be determined in consideration of the diameter D5 of the plurality of through-holes 110H. For example, the second diameter D2 may be less than the diameter D5 of the plurality of through-holes 110H. The body portion 122 may be required to have a certain level of flexural rigidity so as not to be bent or deformed by external force in the longitudinal direction (Z-axis direction) in the process of applying the flux. Accordingly, the body portion 122 may have a greater diameter than that of the flux holding portion 125.

The flux holding portion 125 is a portion for dotting the flux on the substrate by applying the flux to the end thereof, and at least a portion of the flux holding portion 125 may be exposed externally of the housing 110. However, embodiments of the present disclosure are not limited thereto, and the flux holding portion 125 may be configured to be accommodated in the housing 110. The flux holding portion 125 may extend in the first direction (Z-axis direction) from the body portion 122 and may be disposed to correspond to each of the plurality of through-holes 110H. The flux holding portion 125 may have a smaller diameter than the body portion 122 so as to adjust the amount of flux gripping to correspond to a fine-pitch pattern or pad. For example, the flux holding portion 125 may have a third diameter D3 smaller than the second diameter D2 of the body portion 122. In this case, the third diameter D3 may be determined according to the size of a solder ball to be formed, the size of the pad on which the solder ball is bumped, or the size of the opening for exposing the pad on which the solder ball is to be bumped. The flux holding portion 125 may have a cylindrical shape with a constant diameter, but may have a tapered shape with a non-uniform diameter according to an example embodiment. Accordingly, the third diameter D3 may be understood as the diameter of the end of the flux holding portion 125 on which the flux is applied, or a minimum diameter of a wetting portion 124.

According to an example embodiment of the present disclosure, to prevent the problem in which, in the flux dotting process, a portion of the flux to be doped on the pad of the substrate climbs up the flux pin so that a sufficient amount of flux is not dotted to the pad of the substrate, the flux blocking structure 126 limiting the flux wetting region is introduced to a lower portion of the flux pins 120. For example, the flux pins 120 according to example embodiments may include the flux blocking structure 126 protruding from the side surface of the flux holding portion 125 in the second direction (e.g., X-axis and/or Y-axis direction) to block the climbing of the flux. The flux blocking structure 126 is configured such that the flux is applied only to a predetermined area of a lower portion of the flux holding portion 125, and thus a non-wetting portion 123 and the wetting portion 124 of the flux holding portion 125 may be defined. Accordingly, the flux dotting tool according to an example embodiment may maintain a dotting amount or a coating amount at a level capable of stably performing the reflow process even when the flux dotting process is continued for a long period of time. Also, according to example embodiments, the flux dotting amount of the flux pins 120 may be adjusted by changing the position and/or shape of the flux blocking structure 126 or changing the shape of the wetting portion 124. This will be described later with reference to FIGS. 2A to 7.

The elastic structure 130 may be configured to be disposed on the plurality of flux pins 120 in the internal space 110R of the housing 110 to impart elastic force in the axial direction (Z-axis direction) of the plurality of flux pins 120. Accordingly, the plurality of flux pins 120 may reciprocate in the axial direction (Z-axis direction) when in contact with the flux plate or substrate during flux dipping and doping. The elastic structure 130 may include a compression spring, a coil spring, or the like fixed in the housing 110, and may be configured to directly transmit elastic force to the plurality of flux pins 120 or to transmit elastic force through a separate pressing member. The elastic structure 130 may be disposed to correspond to each of the plurality of flux pins 120, but may also be disposed in a smaller number than the plurality of flux pins 120 according to example embodiments.

As described above, embodiments of the present disclosure introduce the flux blocking structure 126 capable of limiting the wetting region of the plurality of flux pins 120, such that the flux coated on the ends of the plurality of flux pins 120 may be prevented from climbing to the upper portions of the plurality of flux pins 120. As a result, by using the plurality of flux pins 120 including the flux blocking structure 126, a dot amount or a coating amount of flux may be maintained at a level capable of stably performing the reflow process. Hereinafter, the shape of the flux pins according to various embodiments of the present disclosure will be described with reference to the drawings.

Figure 2A:
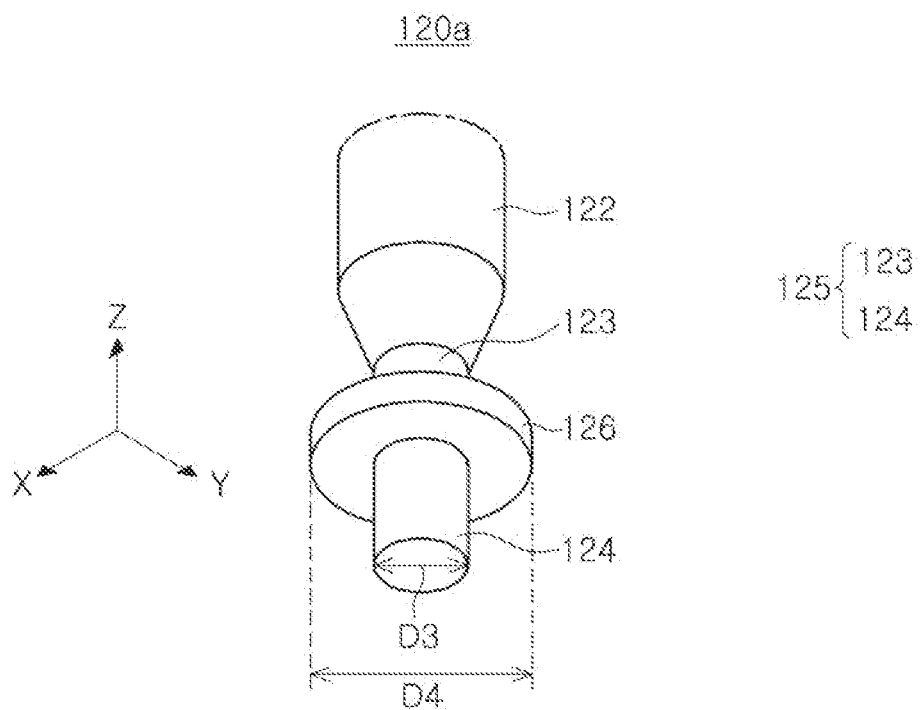
FIG. 2A is a perspective view illustrating a flux pin of a flux dotting tool according to an example embodiment.
Figure 2B:
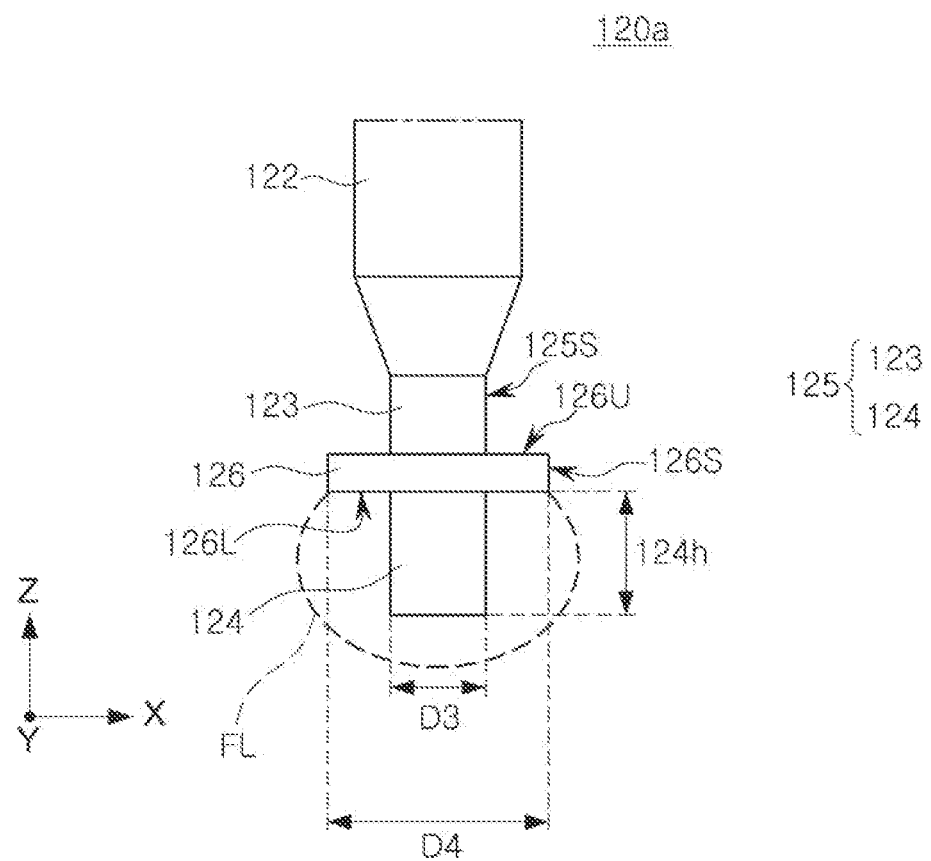
FIG. 2B is a side cross-sectional view illustrating a side of the flux pin.

FIG. 2A is a perspective view illustrating a flux pin 120*a* of a flux dotting tool according to an example embodiment, and FIG. 2B is a side cross-sectional view illustrating a side of the flux pin 120*a*.

Referring to FIGS. 2A and 2B, in the case of the flux pin 120*a* according to an example embodiment, the location and size of the flux blocking structure 126 may be changed, to adjust the dipping amount and dotting amount of the flux coated on the flux holding portion 125. For example, each of a plurality of the flux pin 120*a* extending in a first direction (Z-axis direction) may include a flux holding portion 125 including a wetting portion 124 in contact with the flux FL and a non-wetting portion 123 not in contact with the flux FL during the dipping and dotting process of the flux FL, and a flux blocking structure 126 configured to protrude along a side surface 125S of the flux holding portion 125 to define the wetting portion 124 and the non-wetting portion 123. The flux holding portion 125 may have a cylindrical shape extending in the first direction (Z-axis direction), and the flux blocking structure 126 may protrude in a second direction (for example, the X-axis or Y-axis direction) perpendicular to the side surface 125S of the flux holding portion 125, but the configuration is not limited thereto. In addition, although the flux blocking structure 126 is illustrated in a form that continuously surrounds the side surface 125S of the flux holding portion 125, according to an example embodiment, a plurality of protruding structures may be formed to be spaced apart from one another.

In an example embodiment, a height 124$h$ of the wetting portion 124 may have a ratio ranging from about 1 to about 3, or from about 1.5 to about 2.5, in detail, from about 1.8 to about 2.2, with respect to a third diameter D3 (e.g., minimum diameter) of a distal end surface of the wetting portion 124 in the second direction (e.g., X-axis or Y-axis direction) perpendicular to the first direction (Z-axis direction). If the ratio of the height 124$h$ of the wetting portion 124 to the third diameter D3 of the wetting portion 124 is less than about 1, the wetting region of the flux FL is not sufficiently secured and the required amount of flux FL may not be able to hold. In addition, if the ratio of the height 124$h$ of the wetting portion 124 to the third diameter D3 of the wetting portion 124 exceeds about 3, the wetting region of the flux FL is limited and the effect of increasing the dipping amount and dotting amount of the flux FL may be insignificant.

In an example embodiment, a diameter D4 of the flux blocking structure 126 in the second direction (e.g., X-axis or Y-axis direction) perpendicular to the first direction (Z-axis direction) may have a ratio in the range of about 1 to about 2, about 1.2 to about 1.8, in detail, about 1.3 to about 1.5, with respect to the third diameter D3 of the wetting portion 124. If the ratio of the diameter D4 of the flux blocking structure 126 to the third diameter D3 of the wetting portion 124 is less than about 1, the blocking effect of the flux FL is insignificant, and thus, the flux FL applied to the wetting portion 124 may rise to the non-wetting portion 123 beyond the flux blocking structure 126. In addition, if the ratio of the diameter D4 of the flux blocking structure 126 to the third diameter D3 of the wetting portion 124 exceeds about 2, the width of the flux blocking structure 126 in the horizontal direction may become excessively wide, and thus, it may be difficult to arrange the plurality of the flux pin 120$a$ at a fine pitch.

In this case, the third diameter D3 of the wetting portion 124 may be understood as the diameter of the end of the wetting portion 124 in contact with the flux FL. The third diameter D3 of the wetting portion 124 may be determined by the exposed area of the pad on which the flux FL is to be doped or the exposed area of the pad on which the solder ball is formed. For example, the third diameter D3 of the wetting portion 124 may have a ratio in the range of about 0.5 to about 1, about 0.6 to about 0.9, in detail, about 0.7 to 0.8, with respect to a diameter (refer to 'D6' in FIG. 8) of an opening of a solder resist layer that exposes the pad of the substrate. If the ratio of the third diameter D3 of the wetting portion 124 to the diameter (see 'D6' in FIG. 8) of the opening is less than about 0.5, the amount of flux for stably forming a solder ball in the opening may not be held. In addition, if the ratio of the third diameter D3 of the wetting portion 124 to the diameter of the opening (refer to 'D6' in FIG. 8) exceeds about 1, the amount of dotted flux is relatively great, and thus, the dotting process and the flux washing process efficiency may be lowered, and defects such as coalescence of adjacent solder balls in the solder ball attach process (SBA process) may occur.

According to an example embodiment of the present disclosure, by limiting the position and size of the flux blocking structure 126 as described above, the wetting region of the flux FL applied to the end of the flux holding portion 125 may be limited to the wetting portion 124 below the flux blocking structure 126. Accordingly, in the process of dipping and dotting of the flux FL, a lower surface 126L of the flux blocking structure 126 is in contact with the flux FL, while a side surface 126S and an upper surface 126U of the flux blocking structure 126 may not be in contact with the flux FL. For example, the flux blocking structure 126 may have the lower surface 126L facing the wetting portion 124, the upper surface 126U facing the non-wetting portion 123, and the side surface 126S between the lower surface 126L and the upper surface 126U. The lower surface 126L of the flux blocking structure 126 may be in direct contact with the flux FL aggregated in a spherical or hemispherical shape on the wetting portion 124. As such, according to an example embodiment, an appropriate amount of flux corresponding to the dotting area of the flux may be held, and even when the flux dotting process continues for a long time, the dotting amount of the flux may be maintained at a certain level.

Figure 3:
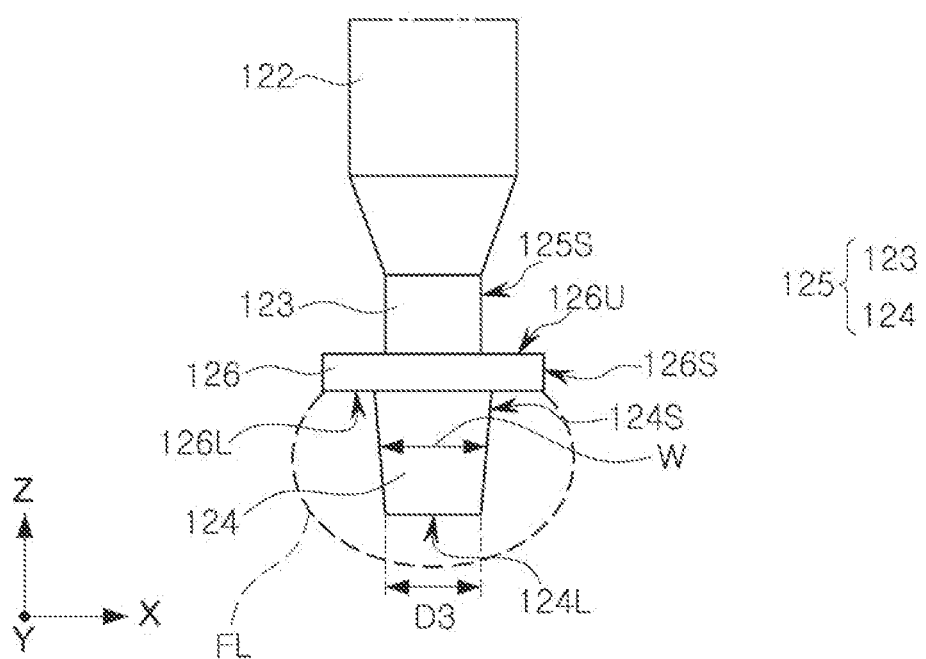
FIG. 3 is a side cross-sectional view illustrating a flux pin of a flux dotting tool according to an example embodiment.

FIG. 3 is a side cross-sectional view illustrating a flux pin 120$b$ of a flux dotting tool according to an example embodiment.

Referring to FIG. 3, the flux pin 120$b$ according to an example embodiment may have the same or similar characteristics as those described with reference to FIGS. 1A to 2B, except that a side surface 124S of the wetting portion 124 has a predetermined angle $\theta$ with the lower surface 126L of the flux blocking structure 126. For example, the wetting portion 124 may have a tapered shape in which the side surface 124S is tapered so that the width W in the horizontal direction (e.g., the X-axis direction) increases as it is adjacent to the flux blocking structure 126. The side surface 124S of the wetting portion 124 may have a predetermined angle $\theta$ with respect to the lower surface 126L of the flux blocking structure 126. For example, the predetermined angle $\theta$ may have a range of about 90 degrees or less, about 60 degrees to about 90 degrees, or about 80 degrees to about 90 degrees. In this case, "about 90 degrees" includes process errors and the like, and may be interpreted as about 85 degrees to about 95 degrees, or about 88 degrees to about 92 degrees, or the like, in a relatively wide range. However, it may be understood that the shape of the wetting portion 124 may not be intentionally formed such that the width W of the wetting portion 124 decreases as it approaches the lower surface 126L of the flux blocking structure 126. In the case in which the angle $\theta$ between the side surface 124S of the wetting portion 124 and the lower surface 126L of the flux blocking structure 126 exceeds about 90 degrees, or in the case in which the width W of the wetting portion 124 decreases as it approaches the lower surface 126L of the flux blocking structure 126, the amount of the flux FL dotted to the substrate or the like may decrease. According to an example embodiment, the amount of the flux FL dotted to the substrate or the like may be increased. In this case, the location and size of the flux blocking structure 126 may also be formed to have a specific ratio with the third diameter D3 of the wetting portion 124 as described with reference to FIGS. 2A and 2B.

Figure 4:
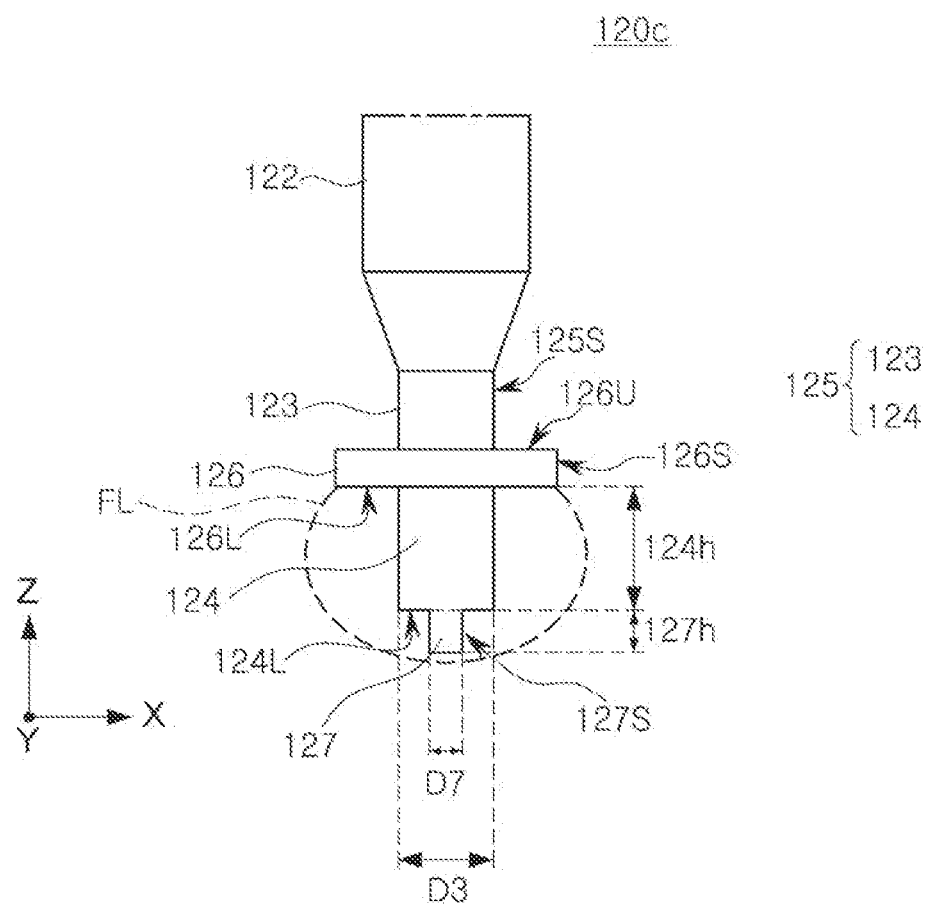
FIG. 4 is a side cross-sectional view illustrating a flux pin of a flux dotting tool according to an example embodiment.

FIG. 4 is a side cross-sectional view illustrating a flux pin 120c of a flux dotting tool according to an example embodiment.

Referring to FIG. 4, the flux pin 120c of an example embodiment may have the same characteristics as or characteristics similar to those described with reference to FIGS. 1A to 3, except that it further includes a protrusion structure 127 protruding from the end of the wetting portion 124. For example, the flux pin 120c may further include the protrusion structure 127 extending in the axial direction (Z-axis direction) from the end or lower surface 124L of the wetting portion 124. The protrusion structure 127 may increase the contact surface of the flux FL such that a relatively larger amount of the flux FL is aggregated around the wetting portion 124. In an example, the protrusion structure 127 may have a diameter D7 less than the third diameter D3 (e.g., minimum diameter) of the wetting portion 124. Also, a height 127h of the protrusion structure 127 may be less than a height 124h of the wetting portion 124. According to an example embodiment, the flux FL fills the space between the lower surface 124L of the wetting portion 124 and the side surface 127S of the protrusion structure 127, and as a result, the amount of the flux FL applied to the flux pin 120c may be increased. In this case, the location and size of the flux blocking structure 126 may also be formed to have a specific ratio with the third diameter D3 of the wetting portion 124 as described with reference to FIGS. 2A and 2B.

Figure 5:
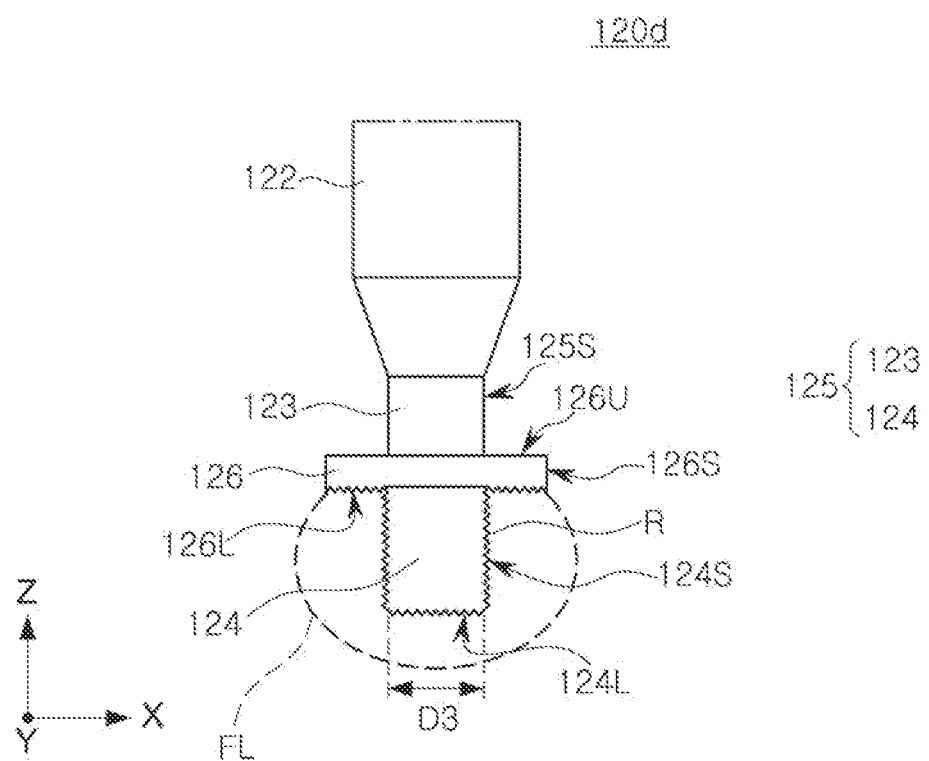
FIG. 5 is a side cross-sectional view illustrating a flux pin of a flux dotting tool according to an example embodiment.

FIG. 5 is a cross-sectional side view illustrating a flux pin 120d of a flux dotting tool according to an example embodiment.

Referring to FIG. 5, the flux pin 120d according to an example embodiment may have the same or similar characteristics as those described with reference to FIGS. 1A to 4, except that roughness is formed on the surface in contact with the flux FL. For example, the flux pin 120d may be configured such that surface roughness R is formed on the lower surface 124L and the side surface 124S of the wetting portion 124 and at least a portion of the lower surface 126L of the flux blocking structure 126. As an example, the surface roughness R is formed on the surface of the wetting region of the flux FL limited by the flux blocking structure 126, for example, on the lower surface 124L and side surface 124S of the wetting portion 124, and on the lower surface 126L of the flux blocking structure 126, to increase the amount of the flux FL coated on the flux pin 120d. In this case, the location and size of the flux blocking structure 126 may also be formed to have a specific ratio with the third diameter D3 of the wetting portion 124 as described with reference to FIGS. 2A and 2B.

Figure 6:
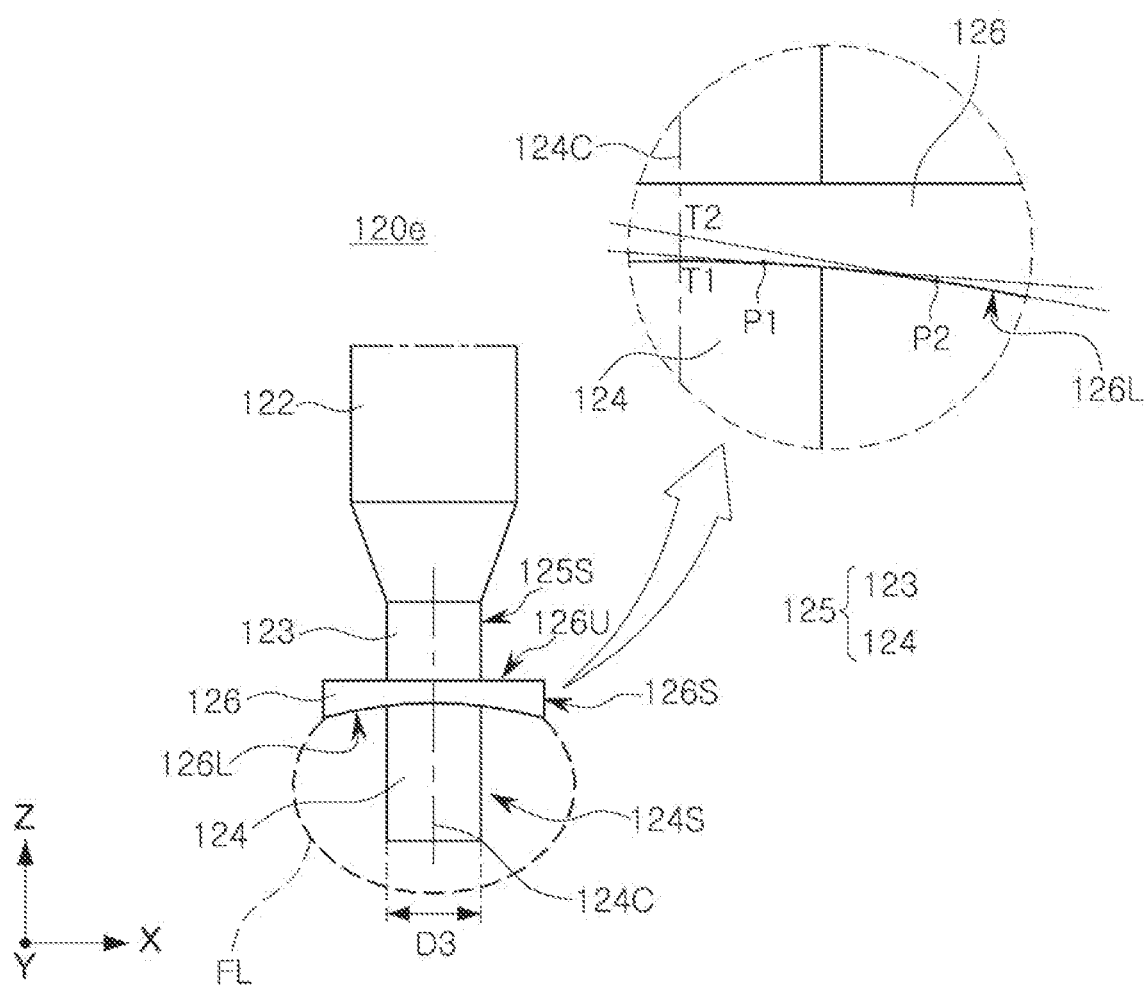
FIG. 6 is a side cross-sectional view illustrating a flux pin of a flux dotting tool according to an example embodiment.

FIG. 6 is a side cross-sectional view illustrating a flux pin 120e of a flux dotting tool according to an example embodiment.

Referring to FIG. 6, in the flux pin 120e of an example embodiment, the lower surface 126L of the flux blocking structure 126 in contact with the flux FL may have the same or similar characteristics as those described with reference to FIGS. 1A to 5, except that the lower surface 126L of the flux blocking structure 126 has a predetermined slope with respect to a central axis 124C of the wetting portion 124. In an example embodiment, the lower surface 126L of the flux blocking structure 126 may have a predetermined slope with respect to the central axis 124C of the wetting portion 124, such that an edge portion thereof (the portion surrounding the wetting portion 124) is inclined downwardly.

In an example, the flux blocking structure 126 may have a lower surface 126L concavely rounded toward the lower end of the flux holding portion 125 or the non-wetting portion 123. For example, a tangent line at a first point P1 of the lower surface 126L of the flux blocking structure 126 has a first slope T1 with respect to the central axis 124C of the wetting portion 124, and a tangent line at a second point P2 of the lower surface 126L of the flux blocking structure 126 may have a second slope T2 that is smaller than the first slope T1, with respect to the central axis 124C of the wetting portion 124. In this case, "slope" may be understood as the magnitude of the slope with respect to the central axis 124C, for example, the absolute value of the slope.

According to an example embodiment, the spherical or hemispherical flux FL applied to the flux pin 120e may have a shape in which the upper portion is surrounded by the lower surface 126L of the flux blocking structure 126, and thus, the amount of the flux FL dotted to the substrate may be increased. In this case, the location and size of the flux blocking structure 126 may also be formed to have a specific ratio with the third diameter D3 of the wetting portion 124 as described with reference to FIGS. 2A and 2B.

Figure 7:
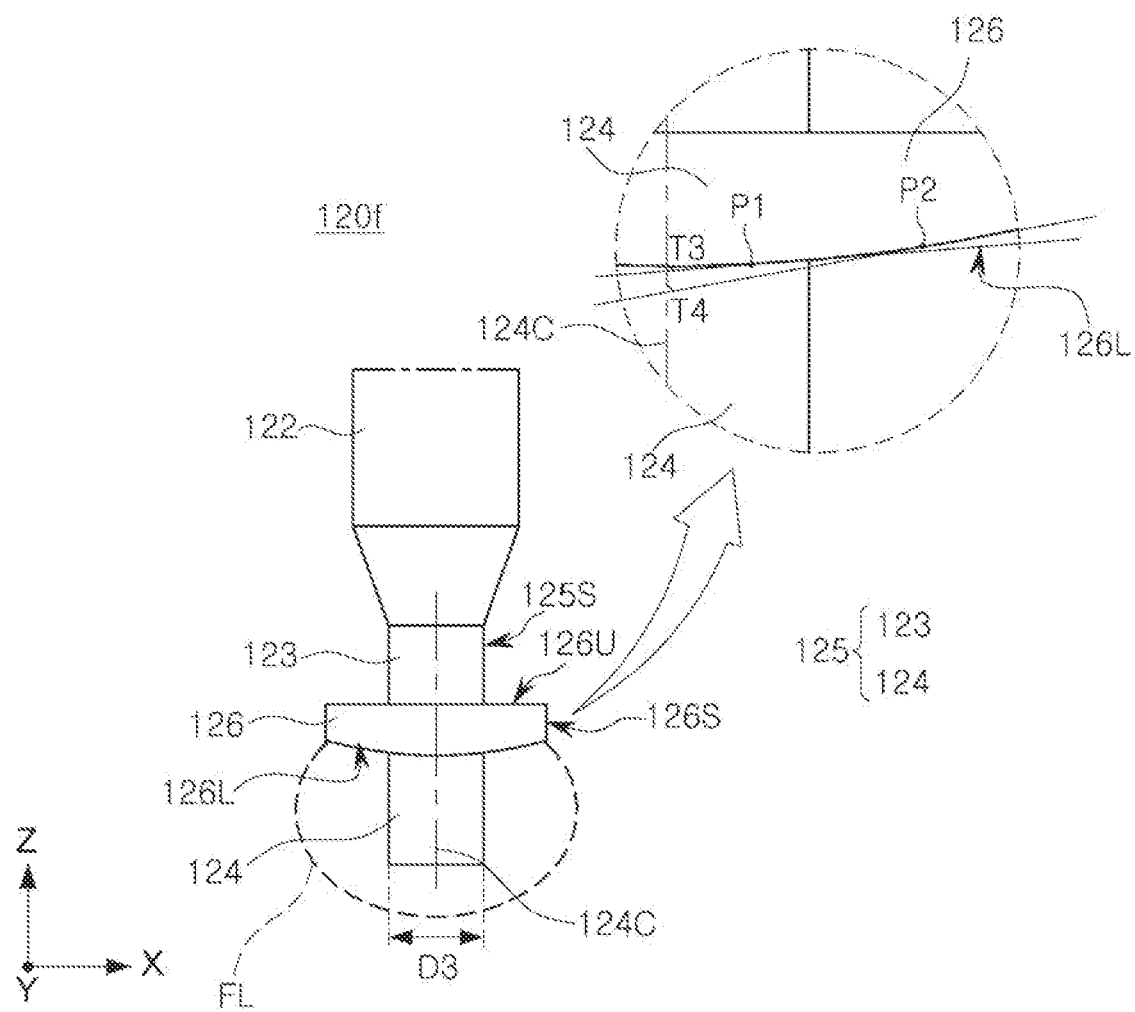
FIG. 7 is a side cross-sectional view illustrating a flux pin of a flux dotting tool according to an example embodiment.

FIG. 7 is a cross-sectional side view illustrating a flux pin 120f of a flux dotting tool according to an example embodiment.

Referring to FIG. 7, the flux pin 120f of an example embodiment may have the same or similar characteristics as those described with reference to FIGS. 1A to 6, except that the lower surface 126L of the flux blocking structure 126 in contact with the flux FL is inclined in the opposite direction to the embodiment illustrated in FIG. 6, with respect to the central axis 124C of the wetting portion 124. In an example embodiment, the lower surface 126L of the flux blocking structure 126 may have a predetermined slope with respect to the central axis 124C of the wetting portion 124 such that a rim portion thereof (the portion surrounding the wetting portion 124) is inclined upwardly. In this case, "slope" may be understood as the magnitude of the slope with respect to the central axis 124C, for example, the absolute value of the slope.

In an example, the flux blocking structure 126 may have a convexly rounded lower surface 126L toward the end of the flux holding portion 125 or the wetting portion 124. For example, a tangent line at a third point P3 of the lower surface 126L of the flux blocking structure 126 has a third slope T3 with respect to the central axis 124C of the wetting portion 124, and a tangent at a fourth point P4 of the lower surface 126L of the flux blocking structure 126 may have a fourth slope T4 smaller than the third slope T3 with respect to the central axis 124C of the wetting portion 124. However, in the present embodiment, the fourth slope T4, and the second slope T2 of FIG. 6, may have different vertical directions.

According to an example embodiment, the spherical or hemispherical flux FL coated on the flux pin 120f may have a shape in which the upper portion surrounds the lower surface 126L of the flux blocking structure 126, and thus, the amount of the flux FL rising along the lower surface 126L of the flux blocking structure 126 may increase. In this case, the location and size of the flux blocking structure 126 may also be formed to have a specific ratio with the third diameter D3 of the wetting portion 124 as described with reference to FIGS. 2A and 2B.

Hereinafter, with reference to the drawings, the effect of maintaining the dot amount of the flux pins 120 to which a technical idea of embodiments of the present disclosure is applied will be described in comparison with the case of using a flux pin 120' of a comparative example.

Figure 8:
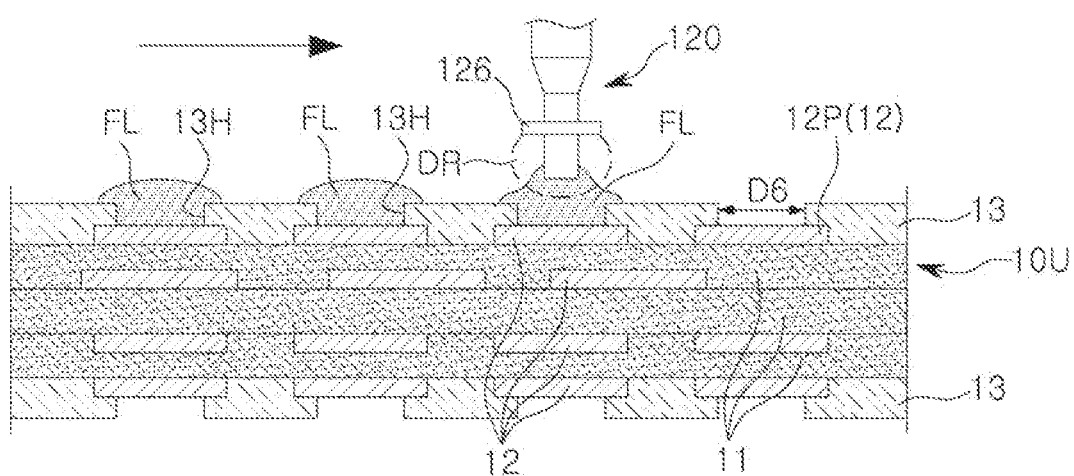
FIG. 8 is a cross-sectional view illustrating a flux dotting process using a flux pin according to an example embodiment.
Figure 9:
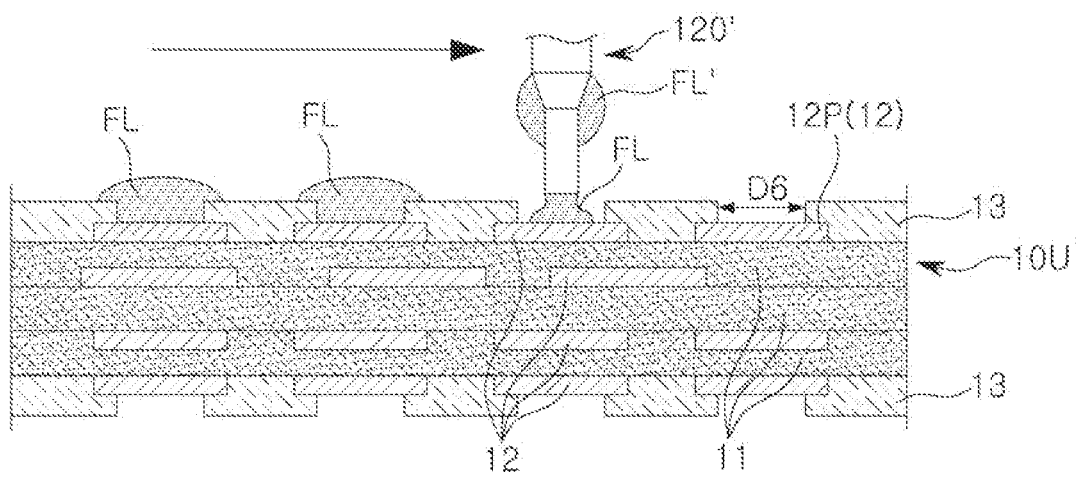
FIG. 9 is a cross-sectional view illustrating a flux dotting process using a flux pin according to a comparative example.

FIG. 8 is a cross-sectional view illustrating a flux dotting process using one of flux pins 120 according to an example embodiment, and FIG. 9 is a cross-sectional view illustrating a flux dotting process using a flux pin 120' according to a comparative example.

First, referring to FIG. 8, a flux dotting process, in which one of the flux pins 120 is brought into contact with the position where the solder ball is to be formed, for example, into contact with one of the openings 13H to which one of the pads 12P is exposed, and the flux FL gripped by the one of the flux pins 120 is seated on the one of the pads 12P, may be repeated. In the drawing, one of the flux pins 120 is illustrated as repeatedly performing the flux doping process on the plurality of openings 13H of the substrate unit 10U, but as described with reference to FIGS. 1A and 1B, substantially, the flux pins 120 may be provided in a number corresponding to the plurality of openings 13H of the substrate unit 10U, and the flux doping process may be performed in units of a plurality of a substrate unit 10U arranged on a substrate strip. The substrate unit 10U may include one or more of an insulating layer 11, one or more of a wiring layer 12, and one or more of a solder resist layer 13. The insulating layer 11 may include an insulating resin, and the wiring layer 12 may include a conductive material patterned on the insulating layer 11. The wiring layer 12 may include pads 12P exposed through the openings 13H of the solder resist layer 13.

According to an example embodiment of the present disclosure, each of the flux pins 120 include a flux blocking structure 126 limiting the wetting region (or dipping region) DR of the flux FL, and the flux FL applied to the flux pins 120 may be aggregated in a spherical or hemispherical shape within the wetting region DR. In the flux FL dotting process, since the flux FL does not rise beyond the flux blocking structure 126, a sufficient amount of the flux FL may be seated on the pads 12P.

On the other hand, referring to FIG. 9, since the flux pin 120' of the comparative example does not include a flux blocking structure limiting the flux wetting region ('DR' in FIG. 8), a portion of the flux FL during the flux dotting process may rise to the upper portion of the flux pin 120' to form remaining flux FL'. Therefore, in the case in which the flux dotting process continues, a sufficient amount of flux FL may not be seated on some of the pads 12P, causing defects such as a missing ball in the subsequent solder ball attach process (SBA) and reflow process.

As set forth above, according to example embodiments, by introducing a flux blocking structure to limit a wetting region of the flux pin, a flux dotting tool having a constant flux dotting amount may be provided.

While non-limiting example embodiments have been illustrated and described above, it will be apparent to those skilled in the art that modifications and variations could be made without departing from the scope of the present disclosure.

What is claimed is:

1. A flux dotting tool comprising:
a housing having an internal space and a plurality of through-holes extending from the internal space to an outside of the housing;
a plurality of flux pins disposed in the internal space to correspond to the plurality of through-holes, respectively, wherein each of the plurality of flux pins comprises a flux holding portion extending in a first direction and exposed to the outside of the housing, and a flux blocking structure that protrudes in a second direction, perpendicular to the first direction, from a side surface of the flux holding portion, and the flux blocking structure is configured to limit a flux wetting region; and
an elastic structure disposed on the plurality of flux pins in the internal space and configured to impart elastic force in the first direction,
wherein the flux holding portion comprises a wetting portion below the flux blocking structure and a non-wetting portion above the flux blocking structure,
wherein a height of the wetting portion in the first direction has a ratio within a range of 1 to 3 with respect to a minimum diameter of a tip surface of the wetting portion in the second direction, and
wherein a diameter of the flux blocking structure in the second direction has a ratio that is greater than 1 and equal to or less than 2 with respect to the minimum diameter of the wetting portion.

2. The flux dotting tool of claim 1, wherein each of the plurality of flux pins further comprises a head portion having a first diameter greater than a diameter of the plurality of through-holes, and a body portion extending from the head portion with a second diameter less than the first diameter and inserted into a respective one of the plurality of through-holes, and
wherein the flux holding portion extends from the body portion.

3. The flux dotting tool of claim 2, wherein the minimum diameter of the wetting portion is less than the second diameter.

4. The flux dotting tool of claim 1, wherein the height of the wetting portion has a ratio in a range of 1.5 to 2.5 with respect to the minimum diameter of the wetting portion.

5. The flux dotting tool of claim 1, wherein the diameter of the flux blocking structure has a ratio within a range of 1.2 to 1.8 to the minimum diameter of the wetting portion.

6. The flux dotting tool of claim 1, wherein the flux holding portion has a cylindrical shape extending in the first direction.

7. The flux dotting tool of claim 1, wherein the wetting portion has a shape in which a side surface of the wetting portion is tapered in such a manner that a width of the wetting portion in the second direction increases as the wetting portion approaches the flux blocking structure.

8. The flux dotting tool of claim 1, wherein each of the plurality of flux pins further comprises a protrusion structure extending from an end of the wetting portion in the first direction and having a diameter less than the minimum diameter of the wetting portion.

9. The flux dotting tool of claim 1, wherein a lower surface and a side surface of the wetting portion and at least a portion of a lower surface of the flux blocking structure have a surface roughness.

10. The flux dotting tool of claim 1, wherein the flux blocking structure has a lower surface convexly rounded toward the wetting portion.

11. The flux dotting tool of claim 1, wherein the flux blocking structure has a lower surface concavely rounded toward the non-wetting portion.

12. A flux dotting tool comprising:
a plurality of flux pins extending in a first direction, the plurality of flux pins each comprising a wetting portion for contacting flux during a dotting process of the flux, and a non-wetting portion; and
a flux blocking structure configured to protrude from a lower portion of each of the plurality of flux pins in a second direction, perpendicular to the first direction, to define the wetting portion and the non-wetting portion, wherein the flux blocking structure comprises:
an upper surface facing the non-wetting portion; and
a lower surface facing the wetting portion.

13. The flux dotting tool of claim 12, wherein the flux blocking structure further comprises a side surface, between the lower surface and the upper surface, that faces in the second direction.

14. The flux dotting tool of claim 12, wherein a height of the wetting portion in the first direction has a ratio in a range of 1 to 3 with respect to a minimum diameter of a tip surface of the wetting portion.

15. The flux dotting tool of claim 12, wherein a diameter of the flux blocking structure in the second direction has a ratio that is greater than 1 and equal to or less than 2 with respect to a minimum diameter of a tip surface of the wetting portion.

16. A flux dotting tool comprising:
a plurality of flux pins comprising a flux holding portion, comprising a wetting portion for contacting with flux during a dotting process of the flux and a non-wetting portion, each of the plurality of flux pins further comprising a flux blocking structure configured to protrude along a side surface of the flux holding portion to define the wetting portion and the non-wetting portion,
wherein a height of the wetting portion has a ratio within a range of 1.5 to 2.5 with respect to a minimum diameter of a tip surface of the wetting portion, and
wherein a diameter of the flux blocking structure has a ratio within a range of 1.2 to 1.8 with respect to the minimum diameter of the wetting portion.

17. The flux dotting tool of claim 16, wherein the minimum diameter of the wetting portion is a diameter of a distal end of the wetting portion.

18. The flux dotting tool of claim 16, wherein the minimum diameter of the wetting portion has a ratio within a range of 0.5 to 1 with respect to a diameter of an opening through which the flux is to be dotted.

19. The flux dotting tool of claim 16, wherein the flux blocking structure has a lower surface facing the wetting portion, an upper surface facing the non-wetting portion, and a side surface between the lower surface and the upper surface.

* * * * *